United States Patent
Miyake

(10) Patent No.: US 7,057,467 B2
(45) Date of Patent: Jun. 6, 2006

(54) LIGHT-CONTROLLED OSCILLATOR

(75) Inventor: Yasuyuki Miyake, Toyota (JP)

(73) Assignee: Denso Corporation, Kariya (JP)

( * ) Notice: Subject to any disclaimer, the term of this patent is extended or adjusted under 35 U.S.C. 154(b) by 22 days.

(21) Appl. No.: 10/849,110

(22) Filed: May 20, 2004

(65) Prior Publication Data
US 2004/0251976 A1    Dec. 16, 2004

(30) Foreign Application Priority Data
May 30, 2003    (JP)    ............... 2003-155103

(51) Int. Cl.
*G01J 5/00*    (2006.01)
(52) U.S. Cl. ............... 331/66; 331/177 R; 331/34; 331/179; 332/117; 332/119
(58) Field of Classification Search ............... 332/117, 332/119; 331/66, 177 R, 179, 34
See application file for complete search history.

(56) References Cited

U.S. PATENT DOCUMENTS
5,821,825 A    10/1998    Kobayashi ............... 331/66

FOREIGN PATENT DOCUMENTS
JP    A-H11-298034    10/1999
JP    A-2001-111498    4/2001

*Primary Examiner*—Arnold Kinkead
(74) *Attorney, Agent, or Firm*—Posz Law Group, PLC

(57) ABSTRACT

A light-controlled oscillator includes a circuit device, a detection circuit and a control circuit. The circuit device changes its characteristics when light is applied, so that a frequency of the oscillation shifts. The detection circuit detects a change of the characteristics caused according to the applied light. The control circuit controls an operation of the oscillator to increase a shift of the frequency of the oscillation according to the change of the characteristics. The oscillation frequency can be shifted by a desired amount only by detecting a change of characteristics based on a condition of the light, even when the intensity of the light is small.

17 Claims, 3 Drawing Sheets

LIGHT-CONTROLLED OSCILLATOR

CROSS REFERENCE TO RELATED APPLICATION

This application is based on Japanese Patent Application No. 2003-155103 filed on May 30, 2003, the disclosure of which is incorporated herein by reference.

BACKGROUND OF THE INVENTION

1. Field of the Invention

The present invention relates to a light-controlled oscillator which shifts an oscillation frequency when light is applied.

2. Description of Related Art

A light-controlled oscillator is disclosed in JP-A-H11-298034. In this light-controlled oscillator, a transistor, whose characteristics change when light is applied, is used in a microwave circuit formed in a monolithic microwave integrated circuit (MMIC). By controlling ON/OFF of the light, this oscillator generates a high-frequency signal which is modulated by frequency shift keying (FSK) modulation.

In the FSK modulation, phase noise correlates with communication quality. Therefore, it is necessary to increase a width of frequency shift in the FSK modulation in order to reduce an influence of the phase noise.

In the above light-controlled oscillator, it is necessary to increase intensity of the light applied to the oscillator in order to ensure a large width of frequency shift. However, when the intensity of the light is increased, the phase noise increases or a frequency stability decreases because a probability of generation and disappearance of carrier in a semiconductor layer reacting to the light increases. Therefore, even when the intensity of the light is increased, communication quality cannot be improved sufficiently.

SUMMARY OF THE INVENTION

In view of the foregoing problems, it is an object of the present invention to provide a light-controlled oscillator which can sufficiently ensure a width of frequency shift even when an intensity of light applied to the oscillator is small.

In order to achieve the above object, a light-controlled oscillator according to the present invention includes a circuit device, a detection circuit and a control circuit. The circuit device generates oscillation. The circuit device changes in characteristics when light is applied, so that a frequency of the oscillation shifts. The detection circuit detects a change of the characteristics of the circuit device according to the applied light. The control circuit controls an operation of the light-controlled oscillator to increase a shift of the frequency of the oscillation according to the change of the characteristics of the circuit device, which is detected by the detection circuit.

Accordingly, the light-controlled oscillator can shift the oscillation frequency by a desired amount only by detecting a change of characteristics of the circuit device based on a condition of the light, even when intensity of the light is small. Therefore, the width of frequency shift can be ensured sufficiently even when the intensity of the light is small, for example, in the case where the light-controlled oscillator is used as a frequency shift keying (FSK) modulator.

BRIEF DESCRIPTION OF THE DRAWINGS

Additional objects and advantages of the present invention will be more readily apparent from the following detailed description of preferred embodiments when taken together with the accompanying drawings, in which.

DETAILED DESCRIPTION OF THE PRESENTLY PREFERRED EMBODIMENTS

Figure 1:
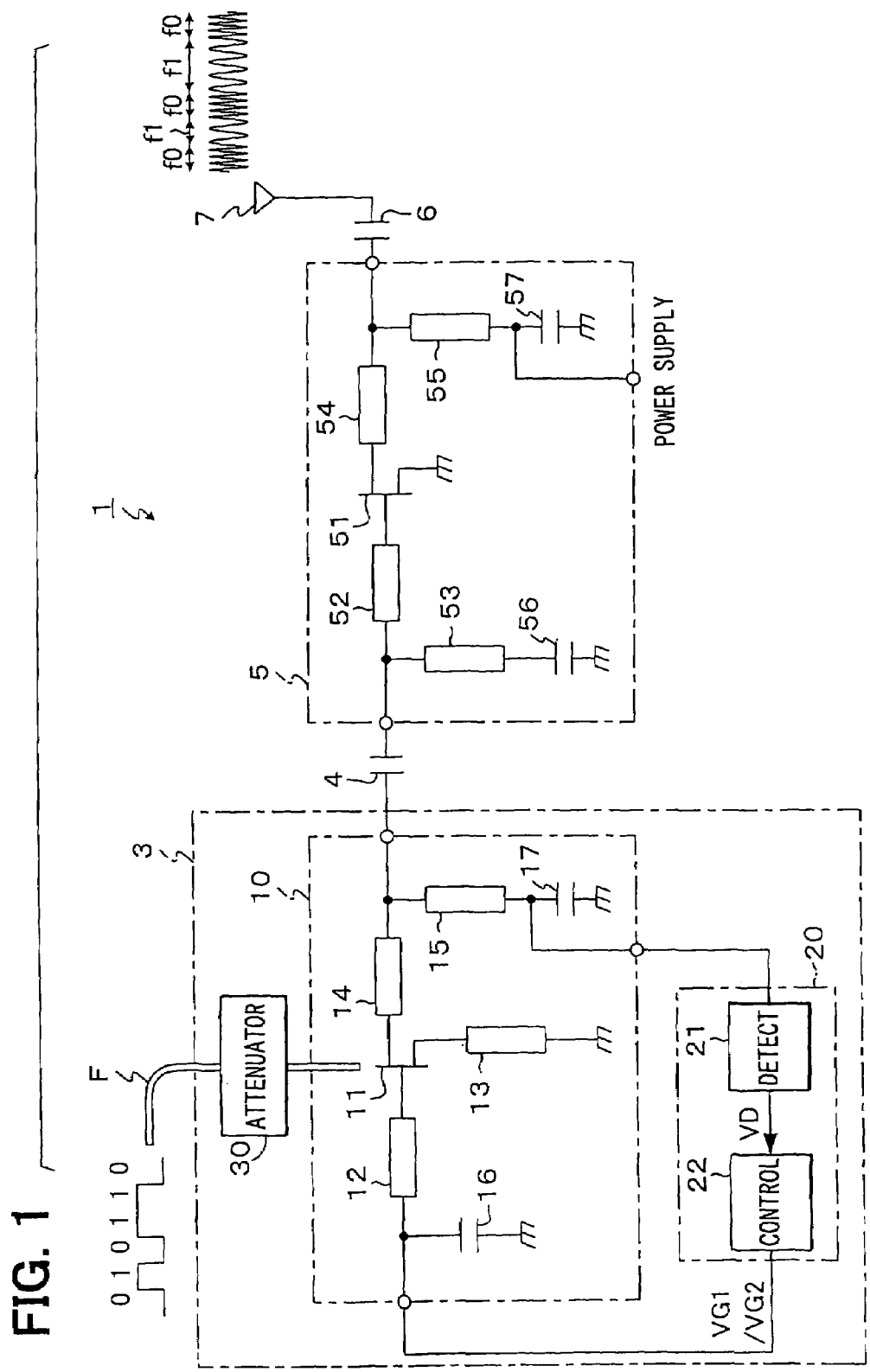
FIG. 1 is a circuit diagram of a frequency shift keying (FSK) modulator according to an embodiment of the present invention.

As shown in FIG. 1, a frequency shift keying (FSK) modulator 1 includes a light-controlled oscillator (hereinafter, referred to as "oscillator") 3, an amplifier 5, an antenna 7 and capacitors 4 and 6. The oscillator 3 shifts its oscillation frequency according to a light signal applied through an optical fiber F. The amplifier 5 amplifies an output of the oscillator 3. The antenna 7 transmits a radio wave as a transmission signal corresponding to an output of the amplifier 5.

The capacitors 4 and 6 are for cutting off direct current components between the oscillator 3 and the amplifier 5, and between the amplifier 5 and the antenna 7, respectively. The oscillator 3 and the amplifier 5 are structured as a monolithic microwave integrated circuit (MMIC). The MMIC has advantages of reduction in manufacturing cost, reduction in unevenness of quality and the like.

The amplifier 5 is a well-known grounded-source amplifier which includes a high electron mobility transistor (HEMT) 51, transmission lines (stubs) 52–55, capacitors 56, 57 for cutting off direct current components. The transmission lines 52, 53 structure an input matching circuit and the transmission lines 54, 55 structure an output matching circuit. The amplifier 5 is supplied with electric power from an electric power circuit at a connection point between the transmission line 55 and the capacitor 57 as a feeding point.

The oscillator 3 includes a series-feedback oscillation circuit 10, a control system 20 and an optical attenuator 30. The series-feedback oscillation circuit 10 includes an HEMT 11, transmission lines 12–15 and capacitors 16, 17 for cutting off direct current components. The control system 20 controls oscillation frequency of the oscillation circuit 10 while supplying electric power to the oscillation circuit 10. The optical attenuator 30 is connected to the optical fiber F and attenuates a light signal transmitted through the optical fiber F. The optical fiber F is disposed to apply the light signal to the HEMT 11 from its end.

A resonance condition of the oscillation circuit 10 is determined by characteristics of the HEMT 11 and the transmission lines 12, 13. The characteristics of the transmission lines 12, 13 are set so that the oscillation frequency is 37 GHz when the light is not applied. The transmission lines 14, 15 of the oscillation circuit 10 structure an output matching circuit.

Figure 2:
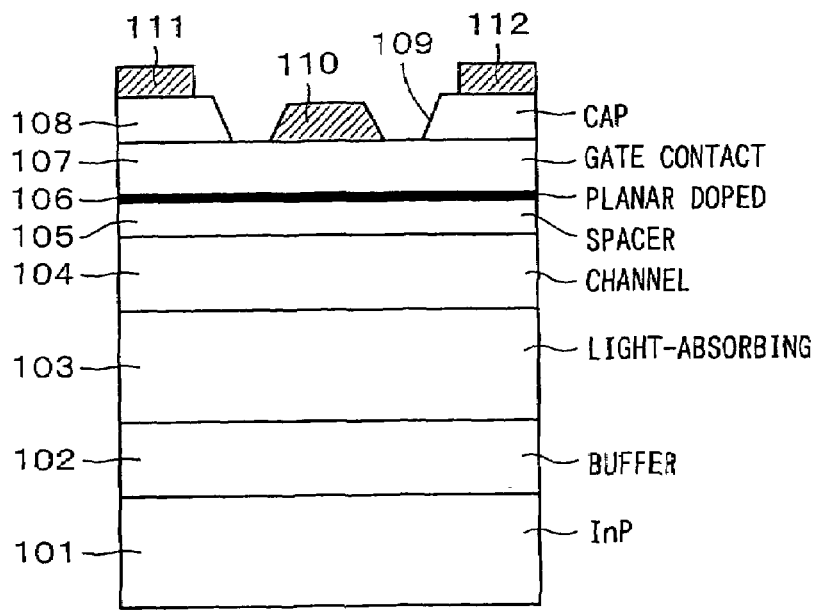
FIG. 2 is a sectional view of a high electron mobility transistor (HEMT)

The HEMT 11 has a sectional structure shown in FIG. 2. That is, on an InP substrate 101, a buffer layer ($In_{0.52}Al_{0.48}As$) 102, a light-absorbing layer ($In_{0.53}Ga_{0.47}As$) 103, a channel layer ($In_{0.80}Ga_{0.20}As$) 104, a spacer layer ($In_{0.52}Al_{0.48}As$) 105, a planar doped layer (Si δ-doping) 106, a gate contact layer ($In_{0.52}Al_{0.48}As$) 107 and a cap layer (n-$In_{0.53}Ga_{0.47}As$) 108 are stacked.

A gate electrode 110 is formed on a portion where the gate contact layer 107 is exposed by forming a recess 109 in the cap layer 108. A source electrode 111 and a drain electrode 112 are formed on the cap layer 108 which is located on both sides of the recess 109. The planar doped layer 106 is formed by adding Si of sheet carrier density $ns=5\times10^{12}$ $cm^{-2}$ after forming the spacer layer 105. The HEMT 11 having the above structure is described, for example, in JP-A-H11-297983.

Figure 3:
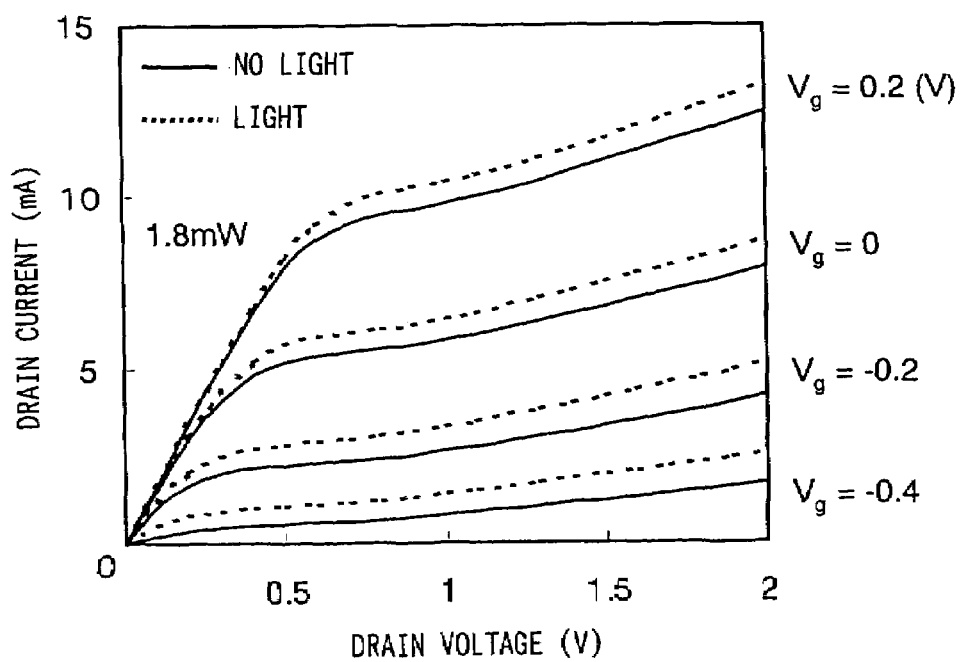
FIG. 3 is a characteristic graph showing a relationship between drain voltage and drain current in the HEMT.
Figure 4:
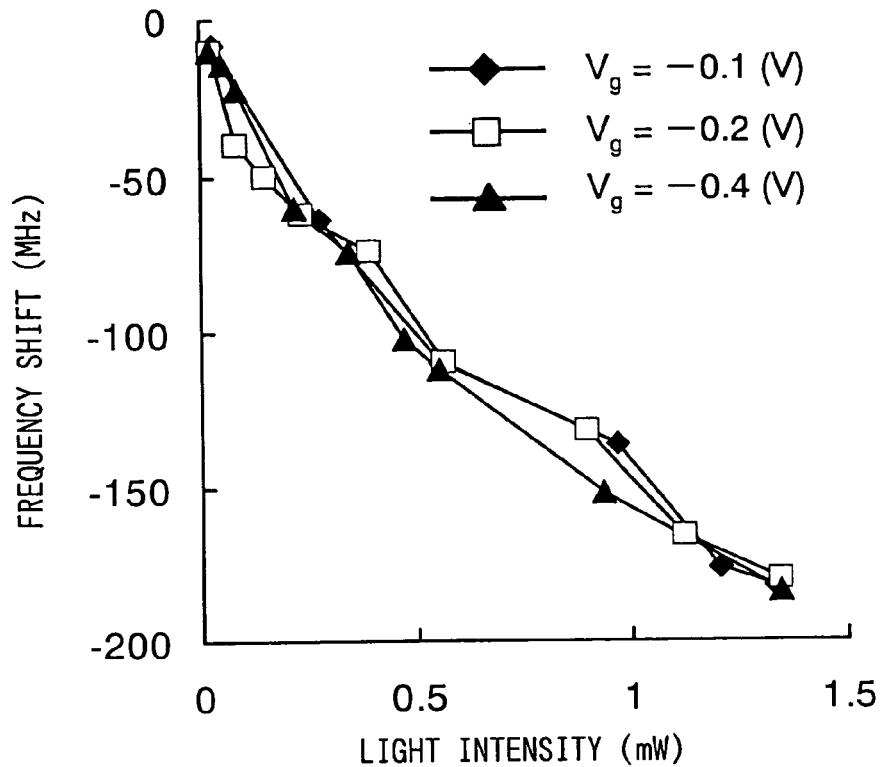
FIG. 4 is a characteristic graph showing a relationship between light intensity and frequency shift amount in an oscillation circuit.

When light is applied to the HEMT 11, electrons and holes are generated in the above semiconductor layers and the amount of carrier increases. Therefore, a drain current increases as shown in FIG. 3 when light is applied to the HEMT 11. When a drain voltage and a gate voltage are fixed, a drain current increases as shown by a dotted line in FIG. 3 when light is applied, in comparison with a case shown by a solid line in FIG. 3 when no light is applied. The above phenomenon that the amount of carrier increases causes a change of capacitance in the HEMT 11. Therefore, the oscillation frequency of the oscillation circuit 10 decreases as shown in FIG. 4.

That is, when a light signal is applied to the HEMT 11 through the optical fiber F, the oscillation frequency of the oscillation circuit 10 shifts in a lower direction according to the light signal. Accordingly, a frequency of radio wave transmitted from the antenna 7 of the FSK modulator 1 shifts. For example, it is assumed that the frequency of radio wave transmitted from the antenna 7 is f0 when no light is applied, that is, the light signal through the optical fiber F is 0. In this case, the frequency of radio wave transmitted from the antenna 7 decreases from f0 to f1 when light is applied, that is, the light signal through the optical fiber F is 1. Therefore, when the light signal through the optical fiber F changes in the order of 0, 1, 0, 1, 1, 0 for example, the frequency of radio wave transmitted from the antenna 7 changes in the order of f0, f1, f0, f1, f1, f0 (see FIG. 1).

Further, a change amount of drain current for light intensity and a width of frequency shift when light of constant intensity is turned on and off are almost constant independently of a gate voltage. For example, when a light signal of intensity 1.8 mW is turned on and off, a change amount of drain current is about 1 mA as shown in FIG. 3. When a light signal of intensity 1.5 mW is turned on and off, the width of frequency shift is about 200 MHz as shown in FIG. 4.

The control system 20 supplies electric power to the oscillation circuit 10 from a connection point between the transmission line 15 and the capacitor 17 as a feeding point. The control system 20 includes a detection circuit 21 and a control circuit 22. The detection circuit 21 detects drain current of the HEMT 11, streaming through the feeding point, and converts the detected drain current to a voltage signal VD. The control circuit 22 controls gate voltage of the HEMT 11 according to the voltage signal VD from the detection circuit 21.

Figure 5:
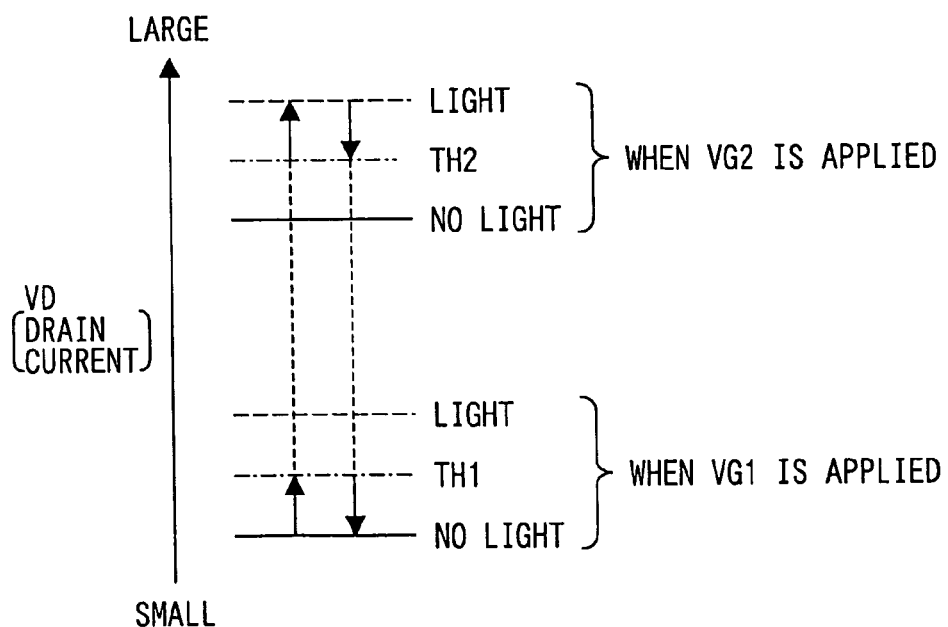
FIG. 5 is a diagram showing a relationship between a setting of first and second threshold values and operation of a control circuit.

The control circuit 22 generates two levels of gate voltage, VG1 and VG2, according to the signal level of the voltage signal VD. Specifically, as shown in FIG. 5, when the output of the control circuit 22 is the first gate voltage VG1, the output is maintained at the first gate voltage VG1 when the voltage signal VD is smaller than a first threshold value TH1. To the contrary, the output is switched to the second gate voltage VG2 when the voltage signal VD becomes larger than the first threshold value TH1. Further, when the output of the control circuit 22 is the second gate voltage VG2, the output is maintained at the second gate voltage VG2 when the voltage signal VD is larger than a second threshold value TH2. To the contrary, the output is switched to the first gate voltage VG1 when the voltage signal VD becomes smaller than the second threshold value TH2. The above circuit can be realized by using a comparator or the like.

The first threshold value TH1 is set to be a magnitude of the voltage signal VD corresponding to a mean value of the drain current detected when light is applied and the drain current detected when light is not applied, when the first gate voltage VG1 is applied. The second threshold value TH2 is set to be a magnitude of the voltage signal VD corresponding to a mean value of the drain current detected when light is applied and the drain current detected when light is not applied, when the second gate voltage VG2 is applied.

That is, when it is assumed that the first gate voltage VG1 is outputted in the initial state, the first gate voltage VG1 is maintained when light is not applied because the voltage signal VD is smaller than the first threshold value TH1. Then, when light is applied, the gate voltage is switched to the second gate voltage VG2 because the drain current increases and the voltage signal VD becomes larger than the first threshold value TH1. While light is applied, the second gate voltage VG2 is maintained because the voltage signal VD is larger than the second threshold value TH2. Thereafter, when the lighting is stopped, the gate voltage is switched to the first gate voltage VG1 because the drain current decreases and the voltage signal VD becomes smaller than the second threshold value TH2.

Accordingly, a change amount of drain current which changes depending on whether light is applied or not can be made to be very large because a change amount based on the gate voltage change is added to the change amount caused by light.

For example, when the light intensity is 1.8 mW, the first gate voltage VG1 is −0.4V and the second gate voltage VG2 is 0V, as shown in FIG. 3, a change amount of drain current by lighting is about 1 mA and a change amount of drain current by changing the gate voltage is about 6 mA. Therefore, the total change amount is about 7 mA.

That is, the drain current can be changed 7 times in comparison with a device which changes drain current only by lighting. As a result, the oscillation frequency of the oscillation circuit 10 can be also shifted more largely. Furthermore, the width of frequency shift can be set to a desired magnitude by adjusting the first and the second gate voltages VG1, VG2.

As described above, according to the FSK modulator 1 in this embodiment, a change of characteristics of the HEMT 11, that is, a condition of the light is detected based on a change of the drain current and the gate voltage applied to the HEMT 11 is switched depending on whether the light is applied or not. Therefore, even when the light intensity is small, the oscillation frequency of the oscillation circuit 10 can be shifted largely and a necessary width of frequency shift for FSK modulation can be ensured. In other words, phase noise can be restricted by reducing the intensity of light applied to the HEMT 11. Therefore, communication quality can be further improved.

Further, in this embodiment, the control system 20 switches two levels of the gate voltage, VG1 and VG2, according to the voltage signal VD. However, it is possible that the control system 20 continuously changes the gate voltage according to the drain current.

What is claimed is:

1. A light-controlled oscillator, comprising:
   a circuit device for generating oscillation, the circuit device changing in characteristics when light is applied so that a frequency of the oscillation shifts;
   an optical attenuating means for attenuating the light applied to the circuit device;
   a detection means for detecting a change of the characteristics of the circuit device according to the applied light; and
   a control means for controlling an operation of the circuit device to increase a shift of the frequency of the oscillation according to the change of the characteristics of the circuit device, which is detected by the detection means.

2. The light-controlled oscillator according to claim 1, wherein the circuit device is a transistor.

3. The light-controlled oscillator according to claim 2, wherein the transistor is a field-effect transistor.

4. The light-controlled oscillator according to claim 3, wherein the detection means detects a change of drain current of the field-effect transistor.

5. The light-controlled oscillator according to claim 3, wherein the control means controls the operation of the circuit device by adjusting a gate voltage of the field-effect transistor.

6. The light-controlled oscillator according to claim 3, wherein:
   the detection means detects a change of drain current of the field-effect transistor;
   the control means selectively applies a first gate voltage and a second gate voltage to a gate electrode of the field-effect transistor;
   the control means switches a gate voltage applied to the gate electrode from the first gate voltage to the second gate voltage only when the first gate voltage is applied to the gate electrode and the drain current detected by the detection means becomes larger than a first threshold value according to a change of light condition; and
   the control means switches the gate voltage applied to the gate electrode from the second gate voltage to the first gate voltage only when the second gate voltage is applied to the gate electrode and the drain current detected by the detection means becomes smaller than a second threshold value according to a change of light condition.

7. The light-controlled oscillator according to claim 6, wherein:
   the first threshold value is substantially set to a mean value of drain current detected when the light is applied and drain current detected when the light is not applied, when the first gate voltage is applied to the gate electrode; and
   the second threshold value is substantially set to a mean value of drain current detected when the light is applied and drain current detected when the light is not applied, when the second gate voltage is applied to the gate electrode.

8. The light-controlled oscillator according to claim 6, wherein the circuit device attains a frequency shift keying modulation by changing the frequency of oscillation in response to the light.

9. The light-controlled oscillator according to claim 2, wherein the transistor is a high electron mobility transistor of InAlAs/InGaAs which is formed on an InP substrate.

10. The light-controlled oscillator according to claim 1, wherein the circuit device, the detection means and the control means are formed in a monolithic microwave integrated circuit.

11. A light-controlled oscillator, comprising:
    a circuit device including a field-effect transistor for generating oscillation, the circuit device changing in characteristics when light is applied so that a frequency of the oscillation shifts;
    a detection means for detecting a change of drain current of the field-effect transistor according to the applied light; and
    a control means for controlling an operation of the circuit device to increase a shift of the frequency of the oscillation according to the change of the characteristics of the circuit device, which is detected by the detection means.

12. The light-controlled oscillator according to claim 11, wherein the control means controls the operation of the circuit device by adjusting a gate voltage of the field-effect transistor.

13. The light-controlled oscillator according to claim 11, wherein:
    the control means selectively applies a first gate voltage and a second gate voltage to a gate electrode of the field-effect transistor;
    the control means switches a gate voltage applied to the gate electrode from the first gate voltage to the second gate voltage only when the first gate voltage is applied to the gate electrode and the drain current detected by the detection means becomes larger than a first threshold value according to a change of light condition; and
    the control means switches the gate voltage applied to the gate electrode from the second gate voltage to the first gate voltage only when the second gate voltage is applied to the gate electrode and the drain current detected by the detection means becomes smaller than a second threshold value according to a change of light condition.

14. The light-controlled oscillator according to claim 13, wherein:
    the first threshold value is substantially set to a mean value of drain current detected when the light is applied and drain current detected when the light is not applied, when the first gate voltage is applied to the gate electrode; and
    the second threshold value is substantially set to a mean value of drain current detected when the light is applied and drain current detected when the light is not applied, when the second gate voltage is applied to the gate electrode.

15. The light-controlled oscillator according to claim 12, wherein the circuit device attains a frequency shift keying modulation by changing the frequency of oscillation in response to the light.

16. A light-controlled oscillator, comprising:
    a circuit device including a transistor for generating oscillation, the transistor including a light-absorbing layer of $In_{0.53}Ga_{0.47}As$ and the channel layer of $In_{0.80}Ga_{0.20}As$ on an InP substrate, and the circuit device changing in characteristics when light is applied so that a frequency of the oscillation shifts;
    a detection means for detecting a change of the characteristics of the circuit device according to the applied light; and
    a control means for controlling an operation of the circuit device to increase a shift of the frequency of the oscillation according to the change of the characteristics of the circuit device, which is detected by the detection means.

17. A light-controlled oscillator, comprising:

a circuit device including a transistor for generating oscillation, the transistor being a high electron mobility transistor of InAlAs/InGaAs where the InGaAs contains In in an amount of at least one of 0.53 and a 0.80, and the circuit device changing in characteristics when light is applied so that a frequency of the oscillation shifts;

a detection means for detecting a change of the characteristics of the circuit device according to the applied light; and a control means for controlling an operation of the circuit device to increase a shift of the frequency of the oscillation according to the change of the characteristics of the circuit device, which is detected by the detection means.

* * * * *